United States Patent [19]

Weaver et al.

[11] Patent Number: 4,965,244
[45] Date of Patent: Oct. 23, 1990

[54] CAF$_2$ PASSIVATION LAYERS FOR HIGH TEMPERATURE SUPERCONDUCTORS

[75] Inventors: John H. Weaver, Golden Valley, Minn.; Robert K. Grasselli, Aurora, Ohio; David L. Nelson, Falls Church, Va.; Harry M. Meyer, III, Coon Rapids; Donald M. Hill, Minneapolis, both of Minn.

[73] Assignee: Regents of the University of Minnesota, Minneapolis, Minn.

[21] Appl. No.: 246,100

[22] Filed: Sep. 19, 1988

[51] Int. Cl.$^5$ .................................................. B05D 5/12
[52] U.S. Cl. ........................................ 505/1; 505/732; 505/730; 427/62; 427/63; 428/696; 428/930
[58] Field of Search ............... 427/62, 63; 505/1, 732, 505/731, 734; 428/696, 697, 688, 689, 930

[56] References Cited

U.S. PATENT DOCUMENTS 4,361,114  11/1982  Gurev ................................. 118/723
4,728,621  3/1988   Graf et al. ............................ 427/41

FOREIGN PATENT DOCUMENTS 57-73178  8/1982  Japan .

OTHER PUBLICATIONS

Bieget et al, "Use of High-Temperature Superconductors in High Speed Electronic Switches With Current Gain", MRS., vol. 99, Nov. 1987, pp. 873–876.
CA110(20): 1,843,924; Manufacture of Ceramic Superconductor Devices with Oxide Passivation Films; Takeuchi et al; Oct. 28, 1988.
CA110(6) 49378K; Passivation of High Tc Superconductor Surfaces With Calcium Floride and Bismuth, Aluminum and Silicon Oxides; Hill et al.; 1988.
J. G. Bednorz et al., *Z. Phys. B*, 64, 189 (1986).
B. A. Biegel, *SPIE: High-Tc Superconductivity: Thin Films and Devices*, 948, 3 (1988).
C. W. Chu et al., *Phys. Rev. Lett.*, 58, 405 (1987).
R. M. Hazen et al., *Phys. Rev. Lett.*, 60, 1657 (1988).
O. K. Kwon et al., *IEEE Electron Dev. Lett.*, 8, 582 (1987).
R. B. Laibowitz, *MRS Bulletin*, 14, 58 (1989).
O. Kohno et al., *Jpn. J. Appl. Phys.*, 26, 1653 (1987).
S. Jin et al., *Appl. Phys. Lett.*, 51, 203 (1987).
J. B. Parise and A. W. Sleight et al., *J. solid State Chem.*, 76, 432 (1988).
M. A. Subramanian and A. W. Sleight et al., *Nature*, 332, 420 (1988).
M. K. Wu et al., *Phys. Rev. Lett.*, 58, 908 (1987).
H. M. Meyer et al., *Appl. Phys. Lett.*, 51, 1118 (1987).
Y. Ichikawa et al., *J. Appl. Phys.*, 27, L381 (1988).
A. W. Sleight et al., *Solid State Commun.*, 17, 27 (1975).
R. J. Cava et al., *Nature*, 332, 814 (1988).
J. M. Longo et al., *J. Solid State Chem.*, 6, 526 (1973).
D. C. Johnston et al., *Phys. Rev. B*, 36, 4007 (1987).
P. M. Grant et al., *Phys. Rev. Lett.*, 58, 2482 (1987).
P. K. Gallagher et al., *Mat. Res. Bull.*, 22, 995 (1987).
H. Maeda et al., *Jpn. J. Appl. Phys.*, 27, L209 (1988).
M. A. Subramanian et al., *Science*, 239, 1015 (1988).
Z. Z. Sheng et al., *Nature*, 332, 55 (1988).
S. A. Chambers et al., *Phys. Rev. B*, 35, 634 (1987).
O. Kohno et al., *Jpn. J. Appl. Phys.*, 26, 1653 (1987).
P. Halder et al., *Science*, 241, 1198 (1988).
Y. Gao et al., in *Thin Film Processing and Characterization of High-Temperature Superconductors;* Amer. Inst. of Phys. Conf. Proc., No. 165.
J. M. Harper, R. J. Colton, L. E. Feldman, Eds.; New York, NY: 1987; p. 358.

*Primary Examiner*—Norman Morgenstern
*Assistant Examiner*—Roy V. King
*Attorney, Agent, or Firm*—Merchant, Gould, Smith, Edell, Welter & Schmidt

[57] ABSTRACT

A CaF$_2$ passivation layer is applied on the surface of a superconducting oxide by evaporation which does not disrupt the superconductive properties of the superconducting oxide.

7 Claims, 4 Drawing Sheets

CAF₂ PASSIVATION LAYERS FOR HIGH TEMPERATURE SUPERCONDUCTORS

GRANT INFORMATION

The present invention was made with the support of the Office of Naval Research under Contract No. N00014-86-K-0427. The Government has certain rights in this invention.

BACKGROUND OF THE INVENTION

Superconductors are materials which can conduct electricity with virtually no resistance when they are maintained at a certain temperature, referred to as the superconductive transition temperature (Tc). For example, pure metals or alloys such as niobium-tin ($Nb_3Sn$) reach the superconductive state when they are cooled below 23K. That degree of cooling requires the use of liquid helium, which condenses at 4K. Liquid helium is expensive and is difficult to manipulate.

A major breakthrough in the commercial development of this technology came in January of 1987, when a yttrium-barium copper oxide ceramic, reported to be $Y_{1.2}Ba_{0.8}CuO_4$, was prepared which achieved superconductivity at a Tc of about 90K. See M. K. Wu et al., *Phys. Rev. Lett.*, 58, 908 (1987). This degree of cooling can be readily acomplished with liquid nitrogen (boiling point, bp, 77K or −196° C.), which is much less expensive and easier to handle than is liquid helium (bp 4.2K).

The advent of liquid nitrogen-cooled superconductors could be a boon to utilities, industry, electronics, transportation and medicine. For example, power companies envision superconductive transmission lines, buried underground, that would carry current with no dissipative losses or generation of heat. Superconducting devices could lead to smaller, more powerful supercomputers. Because these chips produce no waste heat, they could be packed closer together, allowing the size of electronic boxes to be reduced. This size reduction means that signals would take less time to travel between switching devices and circuit elements, leading to smaller, faster computers.

Since the discovery of high temperature superconductivity in the 2-1-4 oxides (of the form $La_{2-x}Sr_xCuO_4$), the 1-2-3 oxides (of the form $YBa_2Cu_3O_{7-x}$), the 2-1-2-2 oxides of Bi and Tl (of the form $Bi_2Ca_{1+x}Sr_{2-x}Cu_2O_{8+y}$ or $Tl_2Ca_{1+x}Ba_{2-x}Cu_2O_{8+y}$), and the 2-2-2-3 oxides of Bi and Tl (of the form $Bi_2Ca_{2+x}Sr_{2-x}Cu_3O_{10+y}$ or $Tl_2Ca_{2+x}Ba_{2-x}Cu_3O_{10+y}$) it has been apparent that the incorporation of these materials into existing and new technologies will require the solution of a large number of materials-related problems. Analogous problems can be anticipated for all such CuO-based superconductors, including systems presently in the early stages of development.

First, there are issues related to materials synthesis so that structures can be fabricated with predetermined shapes, sizes and current-carrying ability. These range from macroscopic to microscopic. Second, there are challenges related to the fabrication of superconducting thin films on a variety of substrates, with Si being an obvious choice from the perspective of microelectronic devices. Third, there are issues related to the formation of stable ohmic contacts, particularly for small samples and thin films. Fourth, there are problems related to the passivation, protection or encapsulation of small structures such as fibers or thin films, so that the superconducting oxides can be used under a wide range of environments.

Early work has shown that the surfaces of these high-Tc ceramics are highly reactive. In particular, adatoms which are reactive with respect to oxide formation cause disruption of the 2-1-4, 1-2-3, and 2-1-2-2 surfaces by withdrawing oxygen from the lattice to form undesirable oxide overlayers with thicknesses that are probably kinetically limited. In a broad sense, passivation layers act to prevent molecular motion across the layer, providing a stabilizing environment which protects the surface of the superconductor from the ambient atmosphere. More specifically, the passivation layers can serve as barriers against loss of oxygen from the superconductor, can isolate one device from another, can act as components in the semiconductor structure, or can provide electrical isolation of multilevel conductive systems.

H. M. Meyer et al., in *Appl. Phys. Lett.*, 51, 1118 (Oct. 1987) reported that evaporated gold films can passivate $La_{1.85}Sr_{0.15}CuO_4$ superconductor surfaces against chemical attack. In an attempt to coat superthin films with dielectric films, Y. Ichikawa et al., in *J. Appl. Phys.*, 27, L381 (1988) used rf-magnetron sputtering to deposit $Nb_2O_5$ films and $Al_2O_3$ films on films of the Y-Ba-Cu-O superconductive ceramic disclosed by M. K. Wu et al., cited hereinabove. The thickness of the dielectric films was reported to be from 600–1350Å. However, these layers deleteriously modified the crystal structure of the Y-Ba-Cu-O films, leading to a broadened superconducting transition zone and a lowered Tc. This group also reported Ba atom diffusion into the dielectric layer, indicating substantial disruption of the ceramic lattice.

Therefore, a need exists for methods to apply stable, effective passivation layers to superconductive ceramic oxides which do not disrupt the useful properties of the superconductor.

SUMMARY OF THE INVENTION

The present invention provides a method to apply a passivation layer to the surface of a superconductive ceramic oxide. The method comprises evaporating aluminum (Al), bismuth (Bi), silicon (Si) or both aluminum and tungsten (Al-W) in an atmosphere of thermally or chemically activated oxygen (O*) so that a dielectric layer of an oxide of Al, Bi, Si or Al-W is applied to said surface. The present invention also comprises applying a passivation layer of $CaF_2$ to the surface of a superconductive ceramic oxide by molecular beam deposition of $CaF_2$ thereon, which deposition does not require the use of activated oxygen. The passivation layers applied are dielectric, as opposed to conductive pure metal layers employed to form ohmic contacts. The present oxide or fluoride passivating layers do not substantially disrupt the ceramic lattice of the superconductor, and therefore can limit the degradation of its electrical or physical properties.

Although the present method is exemplified primarily by the deposition of thin (about 12–100Å) layers to facilitate study of interface-overlayer interactions, layers of any appropriate thickness can be applied. Preferably, the present passivation layers are at least about 50Å in thickness, most preferably about 100Å to 5,000–10,000Å in thickness.

The present method can be employed to apply a passivation layer to the surface of any of the known superconductive ceramic oxides. The structures of several of some preferred classes of these materials is summarized in Table I, below. Other copperoxide-based superconductive ceramic oxides which can be used as substrates in the present method are described hereinbelow.

TABLE I

Superconductive Ceramic Oxides

| Formula[6] | Abbreviation |
|---|---|
| $La_{2-x}A_xCuO_4$ | 2-1-4[1,4] |
| $RBa_2Cu_3O_{7-x}$ | 1-2-3[2,5] |
| $Bi_2Ca_{1+x}Sr_{2-x}Cu_2O_{8+y}$ | 2-1-2-2[3] |
| $Bi_2Ca_{2+x}Sr_{2-x}Cu_3O_{10+y}$ | 2-2-2-3 |
| $Tl_2Ca_{1+x}Ba_{2-x}Cu_2O_{8+y}$ | 2-1-2-2 |
| $Tl_2Ca_{2+x}Ba_{2-x}Cu_3O_{10+y}$ | 2-2-2-3 |

[1] J. G. Bednorz et al., Z. Phys. B., 64, 189 (1986), (A=Sr).
[2] C. W. Chu et al., Phys. Rev. Lett., 58, 405 (1987), (R=Y).
[3] H. Maeda et al., Jpn. J. Appln. Phys., 27, L209 (1988); Z. Z. Sheng et al., Nature, 332, 55 (1988).
[4] A=Ba, Sr, Ca.
[5] R=lanthanide element, e.g., Y, Sm, Eu, Gd, Dy, Ho, Yb.
[6] X and y are stoichiometric values required to satisfy the chemical valence states necessary for superconductivity.

The present invention is also directed to a shaped body of a superconductive ceramic oxide, such as a wire, a microelectronic device, film or the like, having at least one surface thereof coated with a passivation layer of (a) an oxide of Al, Bi, Si or Al-W or (b) $CaF_2$.

As used herein with respect to the present oxide or fluoride layers, the term "passivation" is intended to encompass the protection and/or encapsulation of superconductive structures such as fibers or thin films, as well as their electrical isolation. Therefore, the present invention also comprises a shaped body of a superconductive ceramic oxide having at least one surface coated with a passivation layer of (a) an oxide of Al, Bi, Si or Al-W, or (b) $CaF_2$.

DETAILED DESCRIPTION OF THE INVENTION

Ceramic Superconductors

Figure 1:
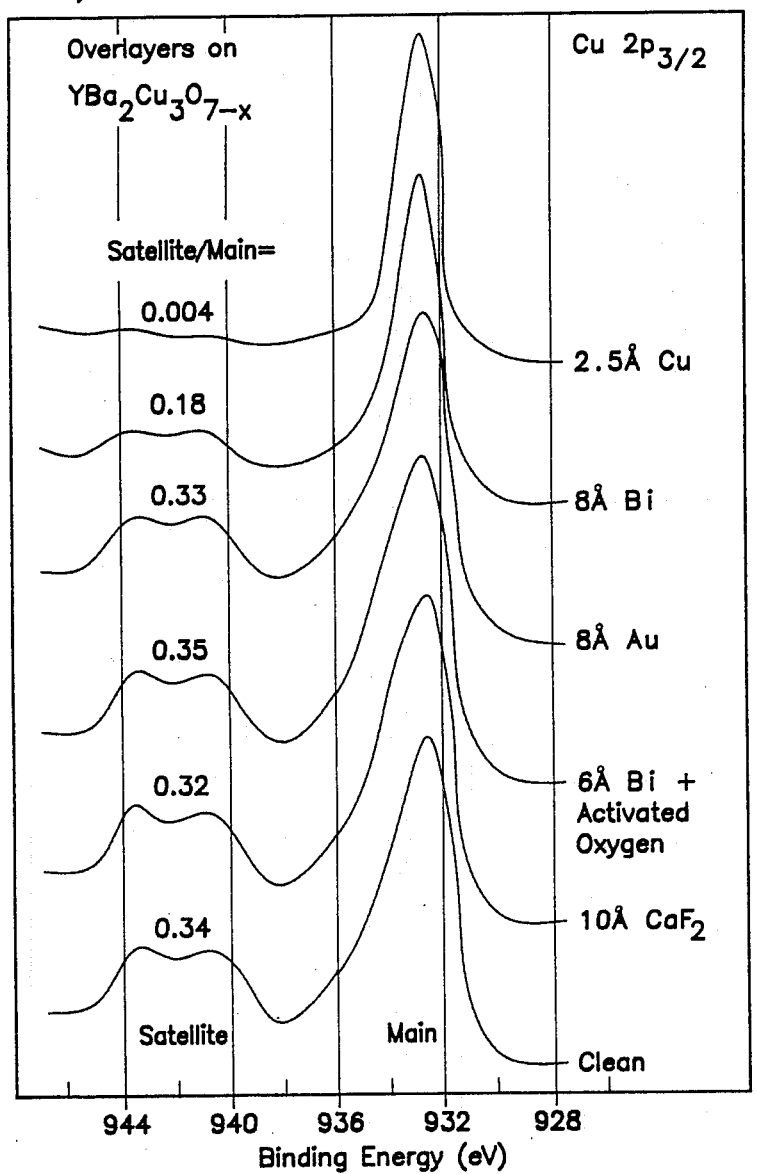
FIG. 1 is a graphical depiction of the Cu $2p_{3/2}$ core level emission for a 1-2-3 superconductor surface treated in accord with the present method.

Superconducting oxides were first reported in 1964, but until recently, the intermetallic compounds showed higher superconducting temperatures. In 1975, research scientists at E. I. DuPont de Nemours discovered superconductivity in the system $BaPb_{1-x}Bi_xO_3$ with a Tc of 13 K (A. W. Sleight et al., Solid State Commun., 17, 27 (1975)). The structure for the superconducting composition in this system is only slightly distorted from the ideal cubic perovskite structure. It is generally accepted that a disproportionation of the Bi(IV) occurs, namely, $2Bi(IV)(6s^1) \rightarrow Bi(III)(6s^2) + Bi(V)(6s^0)$ at approximately 30 percent Bi. Sleight et al. found that the best superconductors were single phase prepared by quenching from a rather restricted single-phase region, and hence these phases are actually metastable materials. At equilibrium conditions, two phases with different values of x would exist; the phase with a lower value of x would be metallic and with a higher value of x would be a semiconductor. It is important to keep in mind that the actual assignment of formal valence states is a convenient way of electron accounting; the actual states include appreciable admixing of anion functions. Recently, for example, Cava and Batlogg, Nature, 332, 814 (1988), have shown that $Ba_{0.6}K_{0.4}BiO_3$ gave a Tc of almost 30K, which is considerably higher than the 13K reported for $BaPb_{0.75}Bi_{0.25}O_3$.

$La_2CuO_4$ was reported by Longo and Raccah, J. Solid State Chem., 6, 526 (1973), to show an orthorhombic distortion of the $K_2NiF_4$ structure with a = 5.363Å, b = 5.409Å and c = 13.17Å. It was also reported that $La_2CuO_4$ has a variable concentration of anion vacancies and may be represented as $La_2CuO_{4-x}$. Superconductivity has been reported for some preparations of $La_2CuO_4$. See D. C. Johnston et al., Phys. Rev. B, 36, 4007 (1987). However, there appears to be some question as to the stoichiometry of these products since only a small portion of the material seems to exhibit superconductivity (P. M. Grant et al., Phys. Rev. Letters, 58, 2482 (1987)).

The $La_{2-x}A_xCuO_4$ ceramics (A = Ca, Sr, Ba), exhibit a Tc of about 40K. The substitution of the alkaline earth cation for the rare earth depresses the tetragonal-to-orthorhombic transition temperature. The transition disappears completely at x>0.2, which is about the composition for which superconductivity is no longer observed.

The compound $YBa_2Cu_3O_{7-x}$ shows a superconducting transition of about 93K and crystallizes as a defect perovskite. The unit cell of $YBa_2Cu_3O_{7-x}$ is orthorhombic (Pmmm) with a=3.8198(1)Å, b=3.8849(1)Å and c=11.6762(3)Å. The structure may be considered as an oxygen-deficient perovskite with tripled unit cells due to Ba-Y ordering along the c-axis. For $YBa_2Cu_3O_{7-x}$, the oxygens occupy 7/9 of the anion sites. One-third of the copper is in four-fold coordination and two-thirds are five-fold coordinated. A reversible structural transformation occurs with changing oxygen stoichiometry going from orthorhombic at x=7.0 to tetragonal at x=6.0 (see P. K. Gallagher et al., Mat. Res. Bull., 22, 995 (1987)). The value x=7.0 is achieved by annealing in oxygen at 400-500° C., and this composition shows the sharpest superconducting transition.

Recently, Maeda et al., cited above, reported that a superconductive transition temperature of 120K was obtained for $Bi_2CaSr_2Cu_2O_8$. In most of the studies reported to date on the Bi/Ca/Sr/Cu/O system, measurements were made on single crystals selected from multiphase products. The group at DuPont selected platy crystals having a composition $Bi_2Sr_{3-x}Cu_2O_{8+y}$ (0.9>x>0.4) which showed a Tc of about 95K. Crystals of $Bi_2Sr_{3-x}Ca_xCu_2O_{8+y}$ for x=0.5 gave orthorhombic cell constants a=5.399, b=5.414, c=30.904 (M. A. Subramanian et al., Science, 239, 1015 (1988)). The structure consists of pairs of $CuO_2$ sheets interleaved by Ca(Sr), alternating with double bismuth-oxide layers.

There are now three groups of superconducting oxides which contain the mixed Cu(II)-Cu(III) oxidation states, namely $La_{2-x}A_xCuO_4$ where A+Ba, Sr or Ca; $RBa_2Cu_3O_{7-x}$ where R is almost any lanthanide; and $Bi_2Sr_{2-x}Ca_{1-x}Cu_2O_{8+y}$. Z. Z. Sheng and A. M. Herman, Nature, 332, 55 (1988) have recently reported on a high-temperature superconducting phase in the system Tl/Ba/Ca/Cu/O. Two phases were identified by R. M. Hazen et al., *Phys. Rev. Lett.*, 60 1657 (1988) namely $Tl_2CaBa_2Cu_2O_9$ and $Tl_2Ba_2Ca_2Cu_3O_{10}$. A. W. Sleight et al. have also reported on the structure of $Tl_2Ba_2CaCu_2O_8$ as well as $Tl_2Ba_2CuO_6$ [M. A. Subramanian and A. W. Sleight et al., *Nature*, 332, 420 (1988); J. B. Parise and A. W. Sleight et al., *J. Solid State Chem.*, 76, 432 (1988)]. In addition, superconductor $Tl_2Ba_2Ca_2Cu_3O_{10}$ has been prepared by the DuPont group and shows the highest Tc of any known bulk superconductor, namely, 125K.

A series of oxides with high Tc values has now been studied for the type $(A^{III}O)_2A_2^{II}Ca_{n-1}Cu_nO_{2+2n}$, where A(III) is Bi or Tl, A(II) is Ba or Sr, and n is the number of Cu-O sheets stacked. To date, n+3 is the maximum number of stacked Cu-O sheets examined consecutively. There appears to be a general trend whereby Tc increases as n increases.

Preparation

The present method can be used for the passivation of superconductive materials, regardless of the method of their preparation. Superconductive ceramic oxides are generally prepared by heating an intimate mixture of the oxide or carbonate powders of the solid elements at temperatures between 900° C. and 1100° C. After regrinding and reheating, the mixture is pressed into pellets and sintered (bonded without melting) at high temperatures for several hours. The pellets are then annealed at a lower temperature, optimally 400° C. to 450° C.

The conditions under which the ceramic is prepared affect its oxygen content. This is important because structural studies have shown that the number and arrangement of oxygen atoms in the lattice is important to the oxide's superconductive properties. In fact, to produce the highest superconducting transition temperatures, the ceramic is preferably heated in an atmosphere of pure oxygen. The ceramic should then be cooled slowly for about 5-6 hours in a furnace.

Characterization of Superconductor Surfaces and the Overlayer-Substrate Interface Electron spectroscopy was used to identify occupied and unoccupied electronic states of the superconductors $La_{1.85}Sr_{0.15}CuO_4$, $YBa_2Cu_3O_{7-x}$, $Bi_2Ca_{1+x}Sr_{2-x}Cu_2O_{8+y}$, and related cuprate compounds. Results from polycrystalline and single crystalline materials reveal that the valence band emission for the 2-1-4, 1-2-3, 2-1-2-2 and 2-2-2-3 superconductors are remarkably similar, with a low density of states near $E_f$, a central feature at about 3.4 eV, and shoulders at 2.1 and 5.4 eV that are derived primarily from Cu-O hybrid states. Comparison with calculated densities of the states shows the importance of correlation effects. Structure in the empty states can be related to La 5d, La 4f, Ba 5d, Ba 4f, Y 4d, Ca 3d, Sr 4d, Bi 5p and O 2p empty states. Core level results show the Cu $2p_{3/2}$ main line and satellite structure associated with formal $Cu^{2+}$ configuration. The O 1s emission reveals inequivalent chemical environments. Interface studies can show substrate disruption, contact formation, and passivation, depending on the overlayer. Ag and Au overlayers have a minimal effect (inert contacts) while the deposition of oxygen-scavanging atoms (Ti, Fe, Cu, Pd, La, Al, In, Bi and Ge) results in oxygen removal and surface disruption.

The invention will be further described by reference to the following detailed example wherein xray photoelectron spectroscopy (XPS) measurements of the interface formation were performed under standard ultra-high vacuum conditions (pressure during measurement less than $1 \times 10^{-10}$ Torr). See S. A. Chambers et al., *Phys. Rev. B*, 35, 634 (1987). A monochromatic beam of $AlK\alpha$ photons ($h\nu + 1486.6$ eV) was focused on the sample surface and the energy of the emitted electrons was measured with a Surface Science Instruments hemispherical analyzer using a resistive anode positionsensitive detector. The photoelectrons were collected at an angle of 60° relative to the surface normal and the cone of acceptance of the analyzer was 30°. The x-ray beam diameter was 300 μm at the sample and the pass energy of the analyzer was 50 eV. The Cu $2p_{3/2}$ emission from pure Cu was used to calibrate the binding energy scale (binding energy of 932.5 eV). Data were acquired and analyzed on a dedicated HP9836C computer. For each of the interfaces studied, the XPS energy distribution curves (EDCs) were measured for the valence bands and the Cu 2p and O 1s core levels, as well as Y 3d, Ba 3d, Bi 4f, Ca 2p, and Sr 3d core levels, as appropriate. Core level binding energy shifts and the attenuation of the substrate core level emission as a function of overlayer thickness were used to identify reacting species and overlayer growth morphology.

$YBa_2Cu_3O_{7-x}$ was obtained from Argonne National Laboratory, IL. Clean surfaces of the various substrate materials for these tests were prepared by fracturing the samples in situ, which exposed uncontaminated internal surfaces. Prior to deposition of any material, the clean surfaces were thoroughly characterized to allow comparison of the initial surfaces and those which had been coated with a particular overlayer.

Deposition of oxides on the superconductors was performed by evaporating the parent material (e.g., Bi, Al or Si) in an ambient atmosphere of activated oxygen. Bi and Si were evaporated from resistively-heated Ta boats, and Al was evaporated from a resistively-heated W basket. Before any deposition, the evaporators were thoroughly degassed (pressure in the chamber was less than $2 \times 10^{-10}$ Torr during evaporation, prior to introducing $O_2$), and the evaporation rates were stabilized at a rate of about 1 Å/minute at the sample. The source-to-sample distance was about 30 cm, and the evaporation rate was measured with an Inficon quartz crystal thickness monitor. High-purity $O_2$ from a stainless steel gas mainfold could be introduced to the chamber via a leak-valve, and the pressure monitored with an ionization gauge. Composition of the gases in the chamber was determined with a quadupole mass spectrometer. The partial pressure of $O_2$ in the deposition chamber was $1.0 \times 10^{-6}$ Torr, and the partial pressure of the residual gases (predominantly CO and $H_2O$) was less than $1 \times 10^{-9}$ Torr. Between the evaporator and the sample was a thorium oxide-coated iridium filament which was electrically isolated from the chamber walls. Passing current through this filament and electrically biasing it negatively relative to the chamber provided a source of energetic electrons to dissociate $O_2$ molecules and ionize O atoms. This activation process had the effect of increasing their chemical reactivity.

Passivation layers were obtained using the following process. First, the sample was cleaved and positioned facing away from the evaporator. Second, a previously degassed boat containing the desired parent metal or $CaF_2$ was heated to the evaporation temperature and the rate of evaporation stabilized. Oxygen was then leaked into the chamber to the desired pressure. (The addition of $O_2$ did not affect the evaporation rates, and other experiments have shown that evaporation of these materials in a non-activated $O_2$ ambient did not produce any significant oxide formation on the substrate, except that produced by reaction with oxygen atoms from the substrate. It is these reactions with the substrate which the activated deposition process inhibits.)

Once the $O_2$ pressure in the chamber was stabilized, the filament was heated and biased to $-250$ V to establish a 50 mA emission current between filament and ground. Mass spectroscopy of the gases present at this point showed O atoms and $O_2$ molecules in equal proportions (partial pressure $=5\times10^{-7}$ Torr) and doubly ionized O ($O^{-2}$) present at roughly 10% of the total pressure (partial pressure $=1\times10^{-7}$ Torr). The sample was then turned to face the evaporator to deposit a particular thickness of oxide. After each deposition, XPS spectra were taken to determine changes on the surface. The Cu $2p_{3/2}$ lineshape was used as an indicator of reaction and to evaluate the emission ratio of the satellite to the main line. The O 1s lineshape was used to qualitatively confirm deposition of oxide layers.

Vapor deposition of $CaF_2$ was done in the same system, without the addition of oxygen using vacuum evaporation techniques. Solid $CaF_2$ was evaporated from tungsten boats, and was deposited on the substrate surface.

EXAMPLE

DEPOSITION OF DIELECTRIC LAYERS ON $YBa_2Cu_3O_{7-x}$

A. Deposition of Bi—O and $CaF_2$

A direct measure of the chemical reactivity and modification of the superconductor surface region can be gained by following the behavior of the Cu $2p_{3/2}$ core level emission feature using x-ray photoemission. The bottom-most curve of FIG. 1 shows the Cu $2p_{3/2}$ lineshape for the clean surface of a freshly fractured sample of $YBa_2Cu_3O_{7-x}$. This complex lineshape, which is observed for the 1-2-3 materials as well as the 2-1-4 and 2-1-2-2 superconductors, indicates that the Cu valence is nominally 2+. We have found that any modification of the superconductor by reactive metal deposition or Ar ion bombardment leads to the loss of the doublet features at higher binding energy, termed the "satellite." The loss of this feature indicates a valence change to $Cu^{1+}$, structural modification of the lattice, and the loss of superconductivity.

The top-most spectrum of FIG. 1 shows that the deposition of only 2.5Å of a reactive metal, Cu, leads to the almost complete loss of satellite doublet (satellite-to-mainline-intensity ratio reduced from 0.34 for the clean surface to 0.04). Such effects are typical for reactive metals, and to date, Ti, Fe, Cu, Pd, La, Al and In have been examined, together with the semiconductors Ge and Si. The results indicate that the Cu valence has changed within a distance of at least 50–60Å of the surface and that a nonsuperconducting, insulating layer is formed, i.e., a poor electrical contact. Moreover, the amount of deterioration will be enhanced by thermal processing. The only metal which leads to no change in the satellite-to-mainlineintensity ratio is Au. The deposition of adatoms of Au leads to a metallic overlayer that does not adversely effect the substrate. The deposition of 10Å of $CaF_2$ also leaves the substrate completely intact with no evidence of disruptive interactions.

Moreover, $CaF_2$ appears to cover the surface uniformly, as judged by the exponential attenuation of the substrate emission. In contrast to the other overlayers discussed hereinabove, $CaF_2$ is a large bandgap insulator with a high static dielectric constant and it is useful as an insulating layer in device fabrication.

As part of these passivation studies, the deposition of metals in an activated-oxygen environment at $1\times10^{-6}$ Torr partial pressures of oxygen was examined. In this way, it was possible to provide activated oxygen from the gas phase to form metal oxide precursors that would not react with oxygen from the superconductor.

In FIG. 1, the results for Bi deposited onto $YBa_2Cu_3O_{7-x}$ both with and without activated oxygen are compared. While not as reactive as Cu metal, an 8Å layer of Bi leads to disruption/reaction on $YBa_2Cu_3O_{7-x}$ as discussed above. In contrast, the Cu 2p lineshape did not change following the deposition of 6Å of Bi in activated oxygen, indicating that the Bi-O overlayer did not significantly modify the superconductor surface.

B. Deposition of $SiO_2$ and Al-W Oxides

Figure 2:
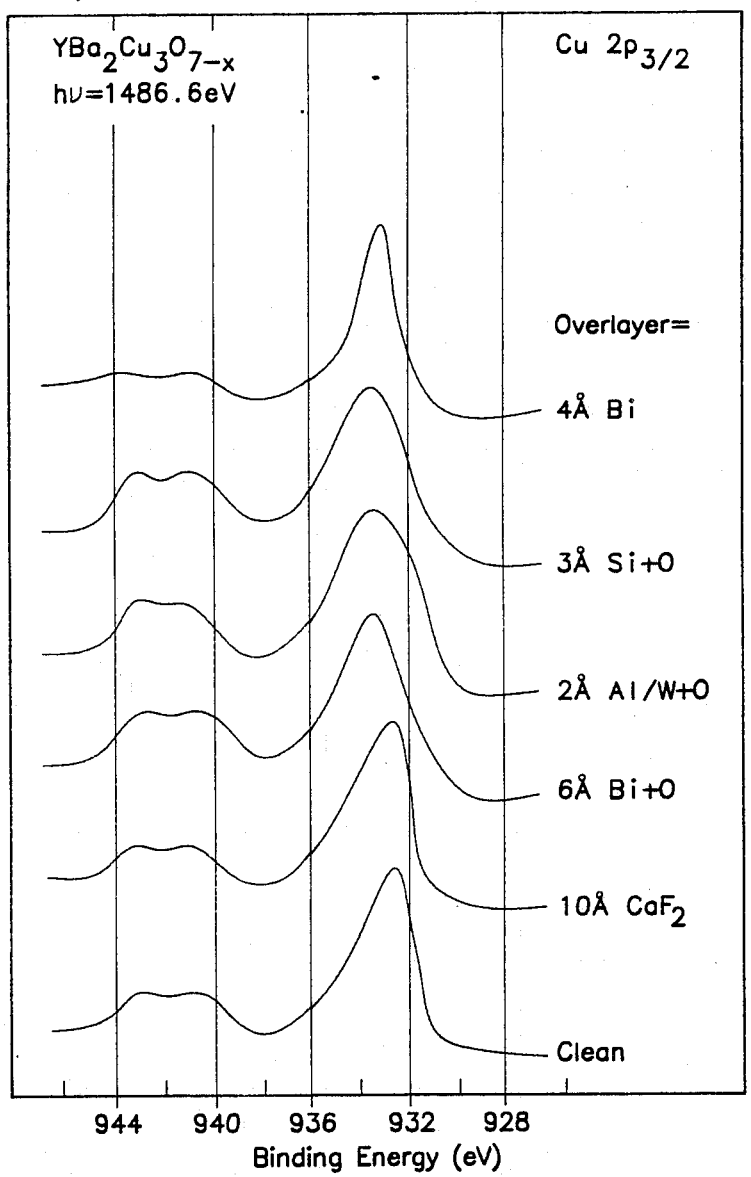
FIG. 2 is a graphical depiction of the Cu $2p_{3/2}$ core level emission for a 1-2-3 superconductor surface treated in accord with the present method.
Figure 3:
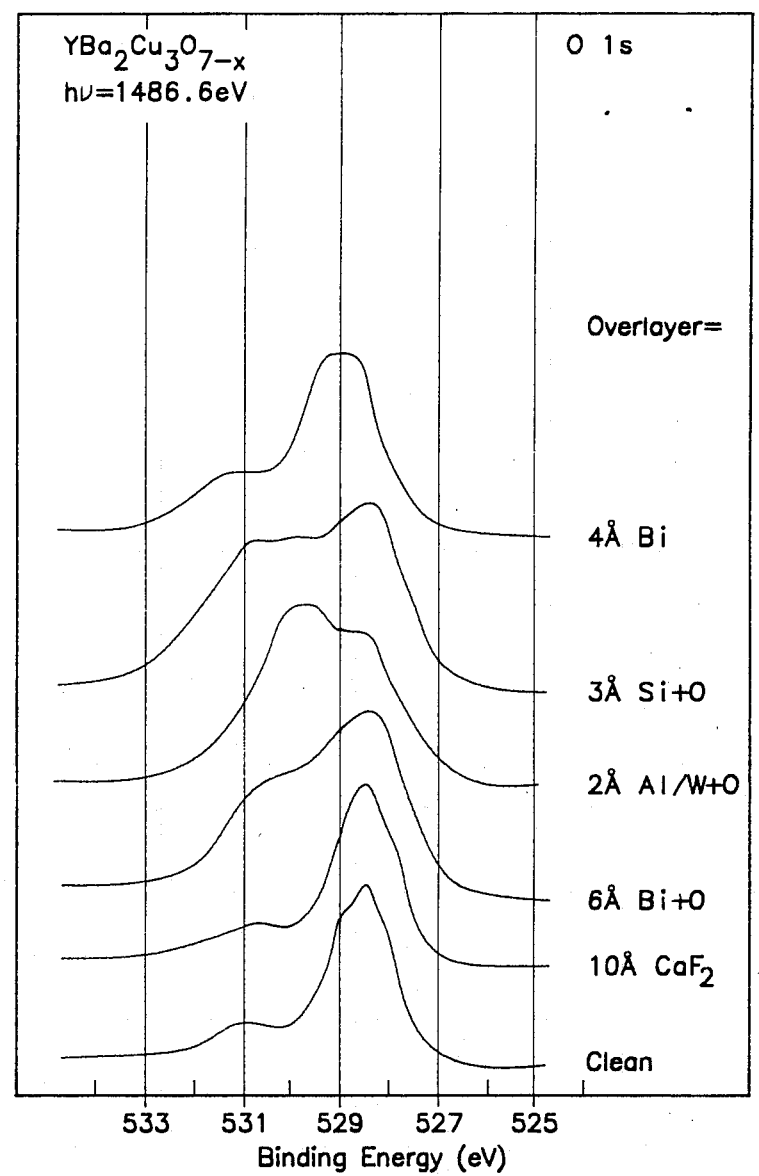
FIG. 3 is a graphical depiction of the 0 1s core level emission for a 1-2-3 superconductor treated in accord with the present method.

FIGS. 2 and 3 summarize the results obtained for the deposition of $SiO_2$ and Al-W oxide layers by the activated chemical vapor deposition of Si and Al. In FIG. 3, the O 1s spectrum for the uncoated ("clean") substrate exhibits a wide asymmetric main peak, indicating the presence of more than one chemical environment. It is made up of a dominant component at about 529 eV, derived from Cu-O planes, and a shallower component, attributed to Cu-O chains. The deposition of Al from a tungsten basket in an activated oxygen atmosphere (filament bias was 250 eV; filament emission was 50 mA; $O_2$ pressure $=1\times10^{-5}$ Torr) resulted in the deposition of an overlayer that is believed to comprise an about 1:1 ratio of aluminum:tungsten oxides. The non-disruptive nature of these dielectric oxide overlayers is confirmed by the persistent emission from the Cu $2p_{3/2}$ satellite structure at about 942 eV binding energy in FIG. 2. FIG. 3 shows the corresponding $O_{1s}$ core level emission, which demonstrates that new oxygen bonding configurations are observed following deposition.

C. Deposition of $Al_2O_3$

Evaporation was done from a coiled W basket in an ambient pressure of $1\times10^{-6}$ Torr $O_2$. The emission current from the thoria-coated filament was 30 mA, and the biasing voltage was $-250$ V. Apparently, the lower pressure and activation current in this test did not create detectable amounts of the volatile W oxide on the basket.

Figure 4:
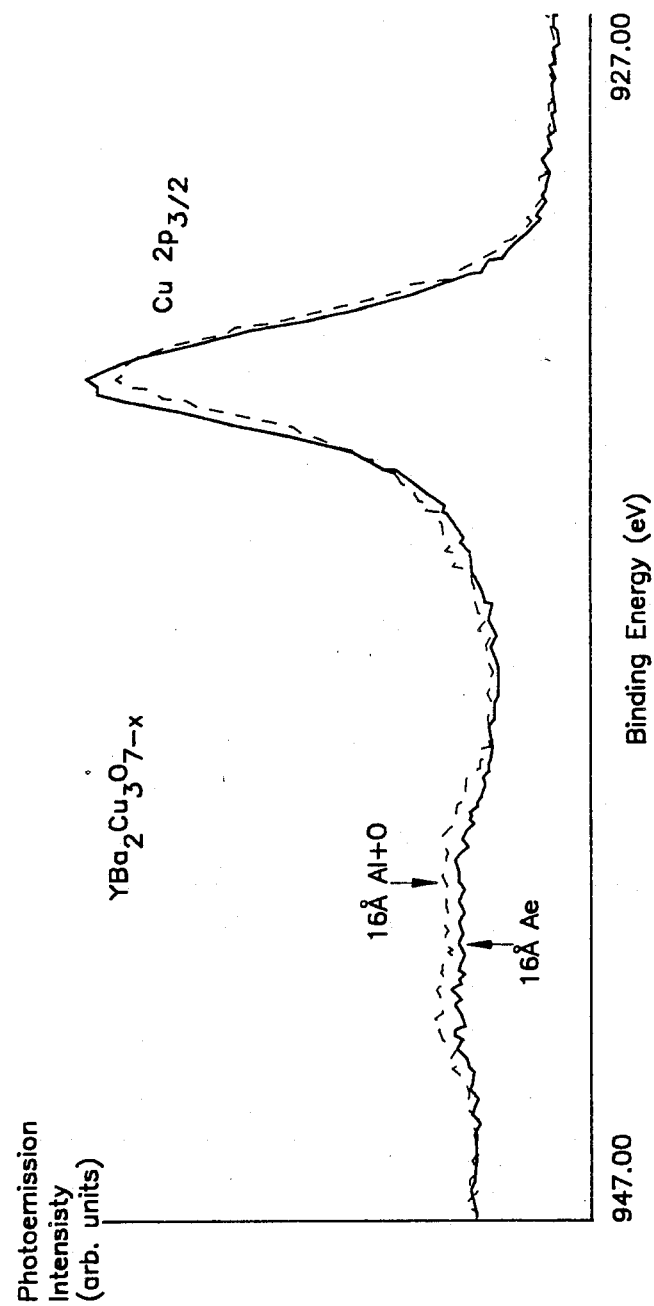
FIG. 4 is a graphical depiction of the Cu $2p_{3/2}$ core level emission for a 1-2-3 superconductor treated with Al or Al in thermally or chemically activated oxygen (O*).

FIG. 4 demonstrates the Cu $2p_{3/2}$ peak for the deposition of 16Å pure Al (dot-dash-line) and for 16Å Al+activated $O_2$ (solid line). The integrated intensity of the satellite emission for the pure Al case was 12% of the main peak intensity, compared to 22% for the activated deposition. The main peak for the activated deposition is also broader than for the pure Al deposition, although the total integrated intensity was the same. Both of these results imply that the deposition of pure Al converts more Cu within the probe depth from the 2+ oxidation state of the superconductor to the 1+ state, characteristic of the disrupted superconductor, and removes more oxygen from the superconductor. These results verify that the deposition of aluminum oxide reacted less with the substrate and withdrew less oxygen from the superconductor than pure Al. No W was detected on the surface after this test.

The invention has been described with reference to various specific and preferred embodiments and techniques. However, it should be understood that many variations and modifications can be made while remaining within the spirit and scope of the invention.

What is claimed is:

1. A method comprising applying a passivation layer of $CaF_2$ to the surface of a superconductive ceramic oxide by evaporation, wherein said $CaF_2$ layer is effective to passivate said oxide surface without disrupting the superconductive properties.

2. The method of claim 1 wherein said $CaF_2$ passivation layer is applied to the surface of a 2-1-4 superconductive ceramic oxide.

3. The method of claim 1 wherein said $CaF_2$ passivation layer is applied to the surface of a 1-2-3 superconductive ceramic oxide comprising Y.

4. The method of claim 1 wherein said $CaF_2$ passivation layer is applied to the surface of a 2-2-2-3 superconductive ceramic oxide comprising Bi.

5. The method of claim 1 wherein said $CaF_2$ passivation layer is applied to the surface of a 2-2-2-3 superconductive ceramic oxide comprising Tl.

6. The method of claim 1 wherein said $CaF_2$ passivation layer is applied to the surface of a superconductive ceramic oxide of the formula $RBa_2Cu_3O_{7-x}$, wherein R is a lanthenide element.

7. The method of claim 1 wherein the passivation layer is about 50–10,000Å in thickness.

* * * * *

UNITED STATES PATENT AND TRADEMARK OFFICE
CERTIFICATE OF CORRECTION

PATENT NO. : 4,965,244

DATED : October 23, 1990

INVENTOR(S) : John H. Weaver et al.

It is certified that error appears in the above-identified patent and that said Letters Patent is hereby corrected as shown below:

At col. 4, lines 55-56, for "$Bi_2Sr_{3-x}Cu_2O_{8-+y}$" read --$Bi_2Sr_{3-x}Ca_xCu_2O_{8+y}$--.

At col. 4, line 65, for "A + Ba," read --A = Ba,--.

At col. 4, line 67, for "$Bi_2Sr_{2-r}Ca_{1-r}Cu_2O_{8+y}$" read --$Bi_2Sr_{2-x}Ca_{1-x}Cu_2O_{8+y}$--.

At Col. 5, line 16, for "n + 3" read --n = 3--.

At col. 6, line 8, for "(hv + 1486.6 eV)" read --(hv = 1486.6 eV)--.

Signed and Sealed this

Twenty-eighth Day of April, 1992

*Attest:*

HARRY F. MANBECK, JR.

*Attesting Officer*      *Commissioner of Patents and Trademarks*